United States Patent
Slowko

(10) Patent No.: US 7,470,915 B2
(45) Date of Patent: Dec. 30, 2008

(54) DETECTOR SYSTEM OF SECONDARY AND BACKSCATTERED ELECTRONS FOR A SCANNING ELECTRON MICROSCOPE

(75) Inventor: Witold Slowko, Wroclaw (PL)

(73) Assignee: Politechnika Wroclawska, Wroclaw (PL)

( * ) Notice: Subject to any disclaimer, the term of this patent is extended or adjusted under 35 U.S.C. 154(b) by 96 days.

(21) Appl. No.: 11/403,823

(22) Filed: Apr. 14, 2006

(65) Prior Publication Data

US 2006/0249674 A1 Nov. 9, 2006

Related U.S. Application Data

(63) Continuation of application No. PCT/PL2004/000078, filed on Oct. 6, 2004.

(30) Foreign Application Priority Data

Oct. 14, 2003 (PL) .................................... 362826

(51) Int. Cl.
*H01J 40/00* (2006.01)
(52) U.S. Cl. ................. 250/397; 250/305; 250/307; 250/310; 250/311; 250/396 R; 313/103 CM; 313/105 CM
(58) Field of Classification Search ........... 250/305, 250/310, 397, 396 R, 307, 311; 313/103 CM, 313/105 CM
See application file for complete search history.

(56) References Cited

U.S. PATENT DOCUMENTS

| | | | |
|---|---|---|---|
| 4,568,188 A * | 2/1986 | Weber et al. | 356/636 |
| 5,389,787 A * | 2/1995 | Todokoro et al. | 250/310 |
| 5,424,541 A * | 6/1995 | Todokoro et al. | 250/310 |
| 5,683,547 A * | 11/1997 | Azuma et al. | 438/695 |
| 5,990,483 A * | 11/1999 | Shariv et al. | 250/397 |
| 6,236,053 B1 * | 5/2001 | Shariv | 250/397 |
| 6,545,277 B1 * | 4/2003 | Kella et al. | 250/310 |
| 6,590,210 B1 | 7/2003 | Essers | |

(Continued)

FOREIGN PATENT DOCUMENTS

EP 0767482 4/1997

(Continued)

OTHER PUBLICATIONS

W. Slowko, "Secondary electron detector with a micro-porous plate for environmental SEM", Vacuum, 2001, 63, Elsevier Science, Ltd., pp. 457 to 461.

(Continued)

*Primary Examiner*—Jack I Berman
*Assistant Examiner*—Michael J Logie
(74) *Attorney, Agent, or Firm*—Walter Ottesen

(57) ABSTRACT

A system for detecting secondary and backscattered electrons in a scanning electron microscope includes a microporous plate (9) that is disposed between a lower scintillator (5) and an upper scintillator (12). The lower scintillator (5) faces toward a specimen stage (11). A movable diaphragm (14) having an aperture (15) is located between the front end of a photomultiplier (7) and the respective ends of an upper light guide (13) and lower light guide (6). Inside an intermediate chamber (3), at least one focusing electrode (8) is placed, with its hole positioned coaxially with the hole in the microporous plate (9). The focusing electrode (8) is located on the surface of the lower scintillator (5).

9 Claims, 1 Drawing Sheet

U.S. PATENT DOCUMENTS

| | | |
|---|---|---|
| 6,646,262 B1 | 11/2003 | Todokoro et al. |
| 6,979,822 B1 * | 12/2005 | Stewart et al. .............. 250/310 |
| 7,049,591 B2 * | 5/2006 | Todokoro et al. ........... 250/310 |
| 7,193,222 B2 * | 3/2007 | Jacka et al. ................. 250/397 |
| 7,385,187 B2 * | 6/2008 | Verentchikov et al. ...... 250/287 |
| 2006/0027748 A1 | 2/2006 | Slowko |

FOREIGN PATENT DOCUMENTS

| | | |
|---|---|---|
| JP | 7122220 | 5/1995 |
| PL | 329339 | 4/2000 |
| WO | WO 98/40906 * | 3/1998 |
| WO | WO 98/40906 * | 9/1998 |

OTHER PUBLICATIONS

PCT/IB/326.

PCT/IB/373.

PCT/ISA/237.

* cited by examiner

DETECTOR SYSTEM OF SECONDARY AND BACKSCATTERED ELECTRONS FOR A SCANNING ELECTRON MICROSCOPE

CROSS REFERENCE TO RELATED APPLICATIONS

This application is a continuation application of international patent application PCT/PL2004/000078, filed Oct. 6, 2004, and claiming priority of Polish patent application no. 362826, filed Oct. 14, 2003, and the entire content of both applications is incorporated herein by reference.

FIELD OF THE INVENTION

The subject of the invention is the detector system of secondary and backscattered electrons for a scanning electron microscope, destined particularly to work at pressures in the order of 100 Pa in the specimen chamber.

BACKGROUND OF THE INVENTION

A secondary electron detector unit is known from Polish patent application no. 329339, entitled "High-Pressure Scanning Electron Microscope" and from U.S. patent application Ser. No. 11/248,431, filed Oct. 13, 2005 (Pub. No. US 2006/0027748 A1), and entitled "Secondary Electron Detector Unit for a Scanning Electron Microscope". This secondary electron detector unit comprises a microporous plate (advantageously, of the microsphere type) and a secondary electron detector of the scintillator type. In both designs mentioned, a secondary electron stream is introduced to the aperture in the lower vacuum wall which is biased at a proper voltage.

The aperture constitutes the lower throttling aperture that limits gas flow from the specimen chamber to the intermediate chamber. Secondary electrons that come into the intermediate chamber are directed toward the input surface of the microporous plate placed at the beam axis and are multiplied on their way through the plate. On the output side of the microporous plate, this amplified stream of the secondary electrons is attracted by the scintillator biased at a high voltage and is finally detected, that is, it is converted into a light signal passing through the light guide to the photomultiplier to be converted into an electric signal once more.

Detectors of the type described cannot detect backscattered electrons efficiently because they have too high energies to be focused in the lower throttling aperture and get into the intermediate chamber. Thus, the output signal of the detector does not contain full information about the specimen, because backscattered electrons carry information as to its material composition while secondary electrons provide information as to its topography.

SUMMARY OF THE INVENTION

It is an object of the invention to provide a detector system of secondary and backscattered electrons for a scanning electron microscope. It is a further object of the invention to provide such a detector system which is equipped with a microporous plate, a focusing electrode and two scintillators connected to light guides and a photomultiplier.

According to a feature of the invention, the microporous plate is disposed between the lower scintillator and the upper scintillator with the lower scintillator being on the specimen stage side. The movable diaphragm with the aperture is located between the face of the photomultiplier and the ends of the upper and lower light guides. Inside the intermediate chamber at least one focusing electrode is placed, with its hole or aperture positioned coaxially with the hole or aperture in the microporous plate.

The focusing electrode is located advantageously on the lower surface of the scintillator.

An advantage of the detector system of secondary and backscattered electrons for a scanning electron microscope in accordance with the invention is its capability of obtaining several signals with one detection unit, that is, the secondary electron signal, the backscattered electron signal, or the sum of these signals.

BRIEF DESCRIPTION OF THE DRAWING

An embodiment of the invention is presented in FIG. 1 which shows, in section, the detection system of secondary and backscattered electrons for a scanning electron microscope.

DESCRIPTION OF THE PREFERRED EMBODIMENTS OF THE INVENTION

Figure 1:
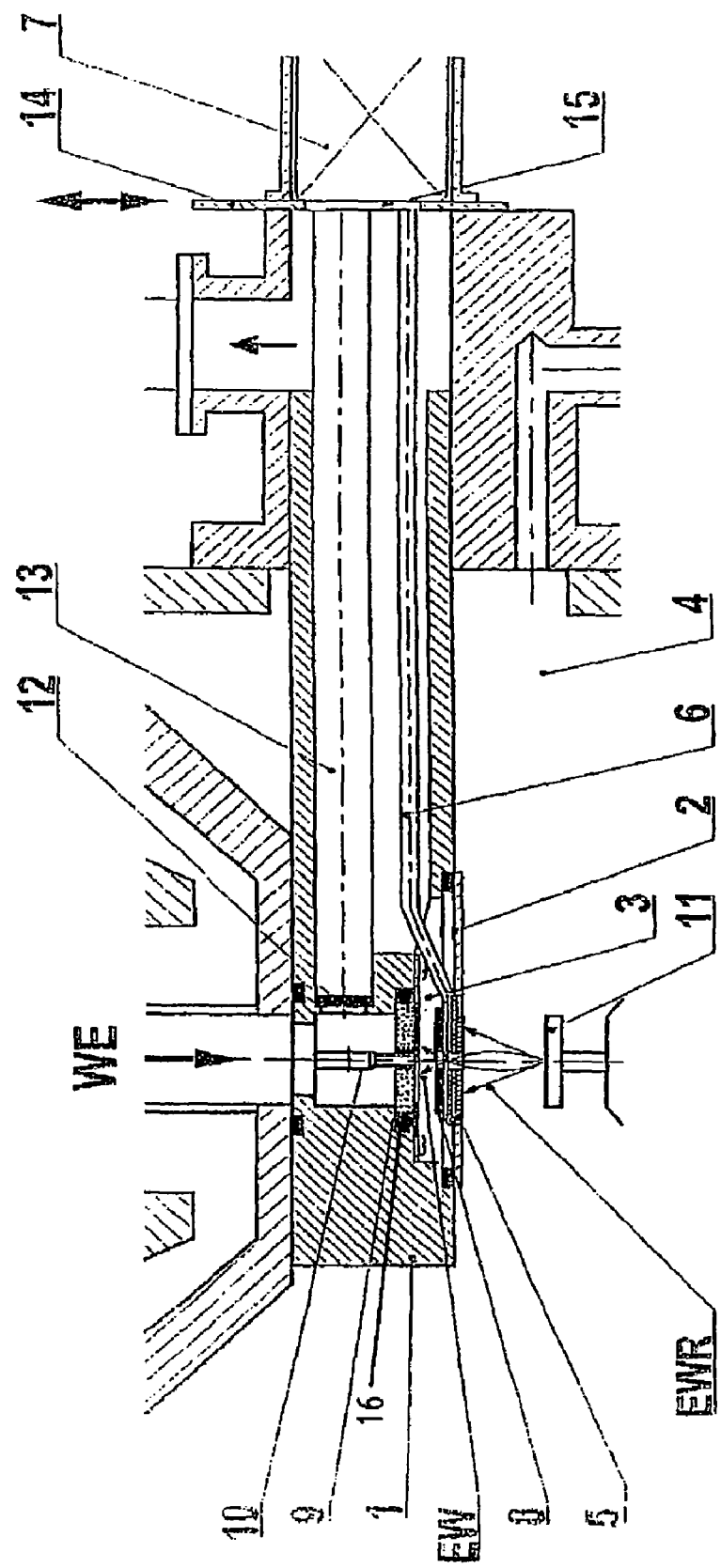

The detection system of secondary and backscattered electrons for a scanning electron microscope is mounted in a head body 1 made of TEFLON. A vacuum wall 2 is located in a lower part of the head body 1. The vacuum wall 2 separates the interior of the head body 1 known as an intermediate chamber 3 from a specimen chamber 4. A lower scintillator 5 in the form of a plate having a small hole or aperture on the axis of an electron beam WE is attached to the vacuum wall 2. The lower scintillator 5 is connected to a lower light guide 6 leading to a photomultiplier 7. A focusing electrode 8 having a hole or aperture placed axially with the electron beam WE is fixed above the lower scintillator 5, or on its upper surface. A microporous plate 9 of microsphere type is fastened on the upper end of the intermediate chamber 3 and is sintered of tiny glass beads. A seal 16 is disoosed between said head body 1 and said microporous plate 9 to ensure a seal-tight interface therebetween. The microporous plate 9 has a hole with a screen tube 10 mounted inside, and placed axially with the electron beam WE which allows the electron beam to pass to a specimen stage 11. An upper scintillator 12 is located above the microporous plate 9 and is connected to an upper light guide 13 leading to the photomultiplier 7. A movable diaphragm 14 having an aperture 15 is placed between the photomultiplier 7 and the respective ends of the upper light guide 13 and the lower light guide 6 as shown.

The operation of the secondary and backscattered electron detector system for a scanning electron microscope is described below.

Backscattered electrons EWR generated from the specimen placed on the specimen stage 11 are characterized by a high kinetic energy and rectilinear trajectories. Because of this, they strike the surface of the lower scintillator 5, where they are converted to a corresponding light signal which is conducted by the lower light guide 6 to the photomultiplier 7 and finally converted to an electric signal. The signal from this detection channel contains information about specimen composition. Alternatively, the secondary electrons EW of low kinetic energies are accelerated and focused on the hole or aperture of the lower scintillator 5 by the electric field of the immersion lens. This electric field is generated because of the bias voltage on three electrodes: the specimen stage 11, the surface of the lower scintillator 5 coated with a thin conducting layer and the focusing electrode 8. The secondary electrons EW travel farther to the microporous plate 9 which functions as an electron multiplier and amplifies the electron signal. Then, the multiplied electrons are attracted by the upper scintillator 12, which is positively biased at a high voltage, and are converted to a light signal which is conducted by the upper light guide 13 to the photomultiplier 7, where the light signal is finally converted to a corresponding electric signal. The signal of secondary electrons EW contains information about the examined surface topography. The movable diaphragm 14 located between the end face of the photomultiplier 7 and the respective ends of the upper light guide 13 and the lower light guide 6, can be used to select the type of signal reaching the photomultiplier 7. At the intermediate position, the ends of both light guides fit within the aperture 15 of the diaphragm 14 and signals generated both by secondary electrons EW and backscattered electrons EWR are present at the photomultiplier 7. The image acquired from the sum of both signals is characterized by mixed topography and composition contrast. The proportion of both components can be adjusted by varying the microporous plate 9 bias voltage, which regulates the amplification of the secondary electron EW current passing through. Shifting the movable diaphragm 14 to opposite end positions results in alternatively masking the upper light guide 13 or lower light guide 6. This allows obtaining images with dominating composition contrast or topography contrast.

It is understood that the foregoing description is that of the preferred embodiments of the invention and that various changes and modifications may be made thereto without departing from the spirit and scope of the invention as defined in the appended claims.

What is claimed is:

1. A detector system for secondary and backscattered electrons in a scanning electron microscope having a specimen stage, the detector system comprising:
   an upper scintillator and a lower scintillator disposed in spaced relationship to each other;
   a focusing electrode and a microporous plate disposed between said upper and lower scintillators;
   said lower scintillator being mounted so as to face toward said specimen stage;
   a photomultiplier;
   a first light guide connecting said lower scintillator to said photomultiplier and a second light guide connecting said upper scintillator to said photomultiplier;
   said photomultiplier having an end face; and,
   said first and second light guides having respective end faces facing toward said end face of said photomultiplier; and,
   a movable diaphragm having an aperture;
   said movable diaphragm further having a first side and a second side facing away from said first side; and,
   said movable diaphragm being mounted between said respective end faces and said end face of said photomuitiplier so as to cause said first side of said movable diaphragm to face toward said respective end faces and said second side of said movable diaphragm to face toward said end face of said photomultiplier.

2. A detector system for secondary and backscattered electrons in a scanning electron microscope having a specimen stage, the detector system comprising:
   an upper scintillator and a lower scintillator disposed in spaced relationship to each other;
   a focusing electrode and a microporous plate disposed between said upper and lower scintillators;
   said lower scintillator having an upper face directed toward said upper scintillator and a lower face;
   said lower scintillator being mounted so as to cause said lower face thereof to face toward said specimen stage;
   a photomultiplier;
   a first light guide connecting said lower scintillator to said photomultiplier and a second light guide connecting said upper scintillator to said photomultiplier; and,
   said focusing electrode being deposited on said upper surface of said lower scintillator.

3. A detector system for secondary and backscattered electrons for a scanning electron microscope having a specimen chamber, the detector system comprising:
   a head body;
   an intermediate chamber arranged in said head body;
   a vacuum wall separating said intermediate chamber from said specimen chamber;
   a photomultiplier;
   a lower scintillator;
   a first light guide connected to said lower scintillator and leading to said photomultiplier;
   an upper scintillator disposed in spaced relationship to said lower scintillator;
   a second light guide connected to said upper scintillator and leading to said photomultiplier;
   a focusing electrode disposed between said lower and upper scintillators;
   a microporous plate arranged in the upper end of said intermediate chamber opposite to said vacuum wall and between said lower and upper scintillators;
   said microporous plate being sealed to said intermediate chamber;
   said lower scintillator being attached to said vacuum wall; and,
   said upper scintillator being positively biased with a high voltage to attract and accelerate electrons multiplied by said microporous plate.

4. The detector system of claim 3, wherein said photomultiplier has an end face; and, said first and second light guides have respective end faces facing toward said end face of said photomultiplier; and, said detector system further comprises a movable diaphragm having an aperture; said movable diaphragm further having a first side and a second side facing away from said first side; and, said movable diaphragm being mounted between said respective end faces and said end face of said photomultiplier so as to cause said first side of said movable diaphragm to face toward said respective end faces and said second side of said movable diaphragm to face toward said end face of said photomultiplier.

5. The detector system of claim 3, wherein said focusing electrode has an aperture and is disposed in said intermediate chamber; said microporous plate has an aperture; and, said aperture of said focusing electrode is coaxial with said aperture of said microporous plate.

6. The detector system of claim 3, wherein said lower scintillator has an upper face; and, said focusing electrode is deposited on said upper surface of said lower scintillator.

7. The detector system of claim 3, wherein said detector system operates at pressures in the order of 100 Pa in said specimen chamber.

8. The detector system of claim 3, wherein said microporous plate provides a vacuum separation between the space above said microporous plate and said intermediate chamber therebelow.

9. The detector system of claim 8, wherein said head body and said microporous plate conjointly define an interface; and, said detector system further comprises a seal disposed at said interface.

* * * * *

UNITED STATES PATENT AND TRADEMARK OFFICE
CERTIFICATE OF CORRECTION

PATENT NO. : 7,470,915 B2
APPLICATION NO. : 11/403823
DATED : December 30, 2008
INVENTOR(S) : Witold Slowko It is certified that error appears in the above-identified patent and that said Letters Patent is hereby corrected as shown below:

<u>Column 2</u>:
Line 37: delete "disoosed" and substitute -- disposed -- therefor.

<u>Column 3</u>:
Line 53: delete "muitiplier" and substitute -- multiplier -- therefor.

Signed and Sealed this

Tenth Day of March, 2009

JOHN DOLL
*Acting Director of the United States Patent and Trademark Office*